United States Patent
Kawasaki et al.

(10) Patent No.: US 8,080,174 B2
(45) Date of Patent: Dec. 20, 2011

(54) FLUORESCENT MATERIAL, PROCESS FOR PRODUCING THE SAME AND ILLUMINATOR EMPLOYING THE SAME

(75) Inventors: Takashi Kawasaki, Machida (JP); Mitsuru Kawagoe, Machida (JP)

(73) Assignee: Denki Kagaku Kogyo Kabushiki Kaisha, Tokyo (JP)

( * ) Notice: Subject to any disclaimer, the term of this patent is extended or adjusted under 35 U.S.C. 154(b) by 496 days.

(21) Appl. No.: 12/303,959

(22) PCT Filed: Jun. 7, 2007

(86) PCT No.: PCT/JP2007/061529
§ 371 (c)(1),
(2), (4) Date: Dec. 8, 2008

(87) PCT Pub. No.: WO2007/142289
PCT Pub. Date: Dec. 13, 2007

(65) Prior Publication Data
US 2010/0219741 A1    Sep. 2, 2010

(30) Foreign Application Priority Data
Jun. 9, 2006    (JP) .................................. 2006-160408

(51) Int. Cl.
*H01L 33/00* (2010.01)
(52) U.S. Cl. .................. 252/301.4 F; 313/486
(58) Field of Classification Search ............ 252/301.4 F; 313/486
See application file for complete search history.

(56) References Cited

U.S. PATENT DOCUMENTS
2007/0108896 A1*  5/2007  Hirosaki ................. 313/506

FOREIGN PATENT DOCUMENTS

| JP | 60-206889 A | 10/1985 |
|---|---|---|
| JP | 05-152609 A | 6/1993 |
| JP | 07-099345 A | 4/1995 |
| JP | 2927279 B2 | 5/1999 |
| JP | 2002-363554 A | 12/2002 |
| JP | 2003-124527 A | 4/2003 |
| JP | 2003-206481 A | 7/2003 |
| JP | 2003-336059 A | 11/2003 |
| JP | 2004-186278 A | 7/2004 |
| JP | 2004-244560 A | 9/2004 |
| JP | 2005-255895 A | 9/2005 |

OTHER PUBLICATIONS

Translation of PCT/ISA/237, IB338, and IB373 of PCT/JP2007/061529.
J. W. H. Van Krebel, "On new rare earth doped M–Si—Al—O—N materials," Tu Eindhoven, The Netherlands, pp. 145-161 (1998).
Extended Abstracts of the 65th Meeting, Japan Society of Applied Physics, (Sep. 2004, Tohoku Gakuin University), No. 3, pp. 1282-1284.
Extended Abstracts of the 52nd Meeting, Japan Society of Applied Physics and Related Societies, (Mar. 2005, Saitama University) No. 3, p. 1615.
Naoto Hirosaki et al., "Characterization and properties of green-emitting β-SiALON:Eu2+ powder phosphors for white light-emitting diodes", Applied Physics Letters, vol. 86, No. 21, pp. 211905.1-211905.3, (2005).
International Search Report (ISR) for PCT/JP2007/061529.
PCT/ISA/237 in PCT/JP2007/061529 and its English translation of Section V.

* cited by examiner

*Primary Examiner* — Carol M Koslow
(74) *Attorney, Agent, or Firm* — Chen Yoshimura LLP

(57) ABSTRACT

A fluorescent material comprising: a β-Sialon expressed by the general formula $Si_{6-Z}Al_ZO_ZN_{8-Z}$ as a host material; and Eu dissolved in solid solution as a luminescence center, is a powder which, when measured by the laser diffraction scattering method, gives particle diameter distribution in which cumulative 10% diameter ($D_{10}$) falls within the 7 μm to 20 μm range and 90% diameter ($D_{90}$) within the 50 μm to 90 μm range, and can be used as a fluorescent material low in luminescence intensity degradation ideal for illuminators. This fluorescent material can be produced by subjecting a raw powder, which is obtained by mixing a silicon nitride powder, aluminum nitride powder, and aluminum-containing or Eu-containing compound as required, to heating at 1850° C. to 2050° C. for 9 hours or longer in a nitrogen or nonoxidizing atmosphere.

7 Claims, 1 Drawing Sheet

FLUORESCENT MATERIAL, PROCESS FOR PRODUCING THE SAME AND ILLUMINATOR EMPLOYING THE SAME

TECHNICAL FIELD

The present invention relates to a fluorescent material, a process for producing the fluorescent material, and an illuminator employing the fluorescent material. Specifically, the invention relates to the fluorescent material comprising a β-Sialon (SiAlON), which emits visible light when excited by ultraviolet or blue light, its production method for the same, and the illuminator employing the fluorescent material such as a white light emitting diode.

BACKGROUND ART

Fluorescent materials comprising silicate, phosphate, aluminate, or sulfide as a host material and containing a transition metal or rare earth metal as a luminescent center are widely known.

Meanwhile, white light-emitting diodes (white LEDs) that emit visible light when excited by a high-energy excitation source such as ultraviolet or blue light have attracted attention, and their development is underway.

However, the above-mentioned conventional fluorescent materials have a problem that their brightness decreases when they are exposed to the excitation source.

As fluorescent materials unsusceptible to decrease in brightness, nitride and oxynitride fluorescent materials, which have stable crystallographic structure and allow shifting the excitation or emission light toward the longer wavelength side, are receiving attention.

As a nitride or oxynitride fluorescent material, an α-Sialon doped with a specific rare earth element is known to have useful fluorescent property, hence its application to a white LED is being investigated (see Patent References 1 to 5 and Nonpatent Reference 1.)

In addition, $Ca_2(Si,Al)_5N_8$, $CaSiAlN_3$, and β-Sialon doped with a rare earth element, have been found to have similar fluorescent property (see Patent References 6 to 8 and Nonpatent References 2 and 3.)

Other fluorescent materials proposed include those that use nitrides or oxynitrides, such as aluminum nitride, magnesium silicon nitride, calcium silicon nitride, barium silicon nitride, gallium nitride, and zinc silicon nitride, as a host material.

A β-Sialon is a solid solution of β silicon nitride in which Si and N sites are substituted with Al and O dissolving in solid solution, respectively. Since there are two formula weight atoms in a unit cell, $Si_{6-z}Al_zO_zN_{8-z}$ is used for a general formula of the β-Sialon. Composition Z in this formula falls within the 0 to 4.2 range, implying a wide solution range, whereas the (Si, Al)/(N, O) molar ratio must be maintained at 3/4. Consequently, silicon oxide and aluminum nitride, or aluminum oxide and aluminum nitride, are generally used, in addition to silicon nitride, as raw materials, and heated to obtain a β-Sialon.

When Eu ions are dissolved thoroughly into a β-Sialon crystal structure, they are excited by ultraviolet or blue light, and emits green or yellow light having wavelengths of 500 to 550 nm.

Unlike monochromatic light, white light of a white LED is produced based on multiple color combinations. As disclosed in Patent References 9 and 10, conventional white LEDs use combinations of an ultraviolet or blue LED and a fluorescent material that generates visible light using the light from that LED as an excitation source. Consequently, if the intensity of light emitted from the fluorescent material is low, that of the white light emitted from the LED also decreases.

Unlike colored light used for signal light or identification lamps, white light is generally used for illuminating objects. Consequently, when a white LED is used as a backlight of display device such a liquid crystal display device or various general illuminators for indoor and outdoor application, obtaining white light having sufficient intensity is essential.

Patent Reference 1: Japanese Patent Laid Open Application No. JP2002-363554A
Patent Reference 2: Japanese Patent Laid Open Application No. JP2003-336059A
Patent Reference 3: Japanese Patent Laid Open Application No. JP2003-124527A
Patent Reference 4: Japanese Patent Laid Open Application No. JP2003-206481A
Patent Reference 5: Japanese Patent Laid Open Application No. JP2004-186278A
Patent Reference 6: Japanese Patent Laid Open Application No. JP2004-244560A
Patent Reference 7: Japanese Patent Laid Open Application No. JP2005-255895A
Nonpatent Reference 1: J. W. H. van Krebel, "On new rare earth doped M-Si—Al—O—N materials," TU Eindhoven, The Netherlands, p. 145-161 (1998)
Nonpatent Reference 2: Extended Abstracts of the 65th Meeting, Japan Society of Applied Physics, (September 2004, Tohoku Gakuin University), No. 3, pp. 1282-1284
Nonpatent Reference 3: Extended Abstracts of the 52nd Meeting, Japan Society of Applied Physics and Related Societies, (March 2005, Saitama University) No. 3, p. 1615
Patent Reference 8: Japanese Patent Laid Open Application No. JP2005-255895A
Patent Reference 9: Japanese Patent Laid Open Application No. JP1993-152609A
Patent Reference 10: Japanese Patent Laid Open Application No. JP1995-99345A
Patent Reference 11: Japanese Patent 2927279

DISCLOSURE OF THE INVENTION

Problems to be Solved by the Invention

The decrease of β-Sialon luminescence intensity and resultant decrease of the luminescence intensity of white LEDs depend largely on the particle diameter of β-Sialon fluorescent materials. Fluorescent light is generated as a result of conversion of excitation light absorbed in a fluorescent material into fluorescent light, but part of the excitation light is not absorbed but reflected on the surface of the fluorescent material, becoming scattered light. The smaller the particle diameter of the fluorescent material, the larger the surface area per unit mass of the fluorescent material. Consequently, even if the mass of fluorescent materials is the same, the smaller the particle diameter, the greater the percentage of their becoming scattered light and being reflected on the surface of the fluorescent material. As a result, the excitation light to be absorbed by the fluorescent material decreases, causing the fluorescence intensity to decrease.

The average particle diameter of the conventional β-Sialon fluorescent material disclosed in Patent Reference 8 had been adjusted to fall within the 50 nm to 20 μm range.

Meanwhile, the fluorescence intensity requirements for white LEDs have recently been increasing at a rapid pace, and consequently, the fluorescence intensity of conventional β-Sialon fluorescent materials is no longer sufficient.

One of the measures to improve luminescence intensity is to maintain fluorescent material powder particle diameter large. To maintain particle diameter large, the powder obtained by burning is broken up while attention is paid to prevent the particles from being broken up too finely, thus allowing large-diameter particles to remain, for example. However, if the average particle diameter of β-Sialon fluorescent material powder is increased, its dispersion properties degrade when used for illuminators, etc., and discoloration results.

An object of the present invention is to solve the problem of conventional technologies described above. The present inventors studied the methods of adjusting particle diameter of β-Sialon fluorescent materials from various aspects, and found that a β-Sialon fluorescent material having specific particle diameter distribution can be obtained by adjusting heating conditions at the time of burning, and that the obtained fluorescent material was free from the problem of conventional technologies owing to its specific particle diameter distribution. The present invention has thus been achieved.

Means for Solving the Problems

In order to achieve the above object mentioned above, there is provided a fluorescent material in accordance with the present invention, expressed by the general formula $Si_{6-Z}Al_ZO_ZN_{8-Z}$ as a host material; and Eu dissolved in solid solution as a luminescence center, when measured by the laser diffraction scattering method, it gives particle diameter distribution in which cumulative 10% diameter ($D_{10}$) falls within the 7 μm to 20 μm range and 90% diameter ($D_{90}$) within the 50 μm to 90 μm range.

A process for producing above-mentioned fluorescent material of the present invention includes: a process in which starting materials comprising any one of silicon nitride powder, aluminum nitride powder, aluminum oxide powder, or an aluminum-containing compound that produces aluminum oxide as a result of decomposition by heating, and europium oxide powder or europium-containing compound that produces europium oxide as a result of decomposition by heating are mixed to obtain raw powder; and a process in which the obtained raw powder is heated in a nitrogen or nonoxidizing atmosphere to obtain β-Sialon fluorescent powder, wherein said heating is performed at a temperature range from 1850 to 2050° C. for 9 hours or longer.

Another aspect of a process for producing the fluorescent material of the present invention includes: a process in which starting materials comprising any one of silicon nitride powder, aluminum nitride powder, aluminum oxide powder, or an aluminum containing compound that produces aluminum oxide as a result of decomposition by heating, and europium oxide powder or europium-containing compound that produces europium oxide as a result of decomposition by heating are mixed to obtain raw powder; and a process in which the obtained raw powder is heated in a nitrogen or nonoxidizing atmosphere to obtain β-Sialon fluorescent powder, wherein said heating is performed at least twice and deagglomeration is performed between said multiple heating operations.

The starting material of the above-mentioned makeup preferably includes a β-Sialon by 1.5% to 20% by mass.

The starting material of the above makeup is preferably enclosed in a boron nitride container having the density of 1.75 g/cm$^3$ or higher for heating.

The illuminator of the present invention is characterized in that: the illuminator including: a fluorescent material; and a luminescence source, said fluorescent material comprising: a β-Sialon expressed by the general formula $Si_{6-Z}Al_ZO_ZN_{8-Z}$ as a host material; and Eu dissolved in solid solution as a luminescence center, wherein said fluorescent material is a powder which, when measured by the laser diffraction scattering method, gives particle diameter distribution in which cumulative 10% diameter ($D_{10}$) falls within the 7 μm to 20 μm range and 90% diameter ($D_{90}$) within the 50 μm to 90 μm range.

The luminescence source of the above makeup preferably emits ultraviolet or visible light.

Effects of the Invention

The fluorescent material made of a Sialon of the present invention is comprising a β-Sialon containing Eu, and because of the unique crystallographic structure of the β-Sialon, Eu functions as the luminescent center, while being excited efficiently by ultraviolet or visible light, thus stably emitting fluorescent light having its peak in the 500 to 550 nm yellow to green visible light range. Consequently, this fluorescent material can be used, by itself or in combination with other fluorescent materials, preferably for various illuminators such as white LEDs that use a blue or ultraviolet LEDs as their light source. The fluorescent material according to the present invention can be produced by the methods to be discussed more fully hereinafter.

When the particle diameter of a conventional fluorescent material powder comprising a β-Sialon is increased to enhance its fluorescence intensity, its dispersion properties degrade, and discoloration results in many cases. Meanwhile, according to the process for producing the fluorescent material comprising a β-Sialon of the present invention allows powders having large particle diameter and good dispersion properties to be produced easily, and therefore with low process cost. The inexpensive fluorescent material comprising a β-Sialon powder having high fluorescence intensity and minimum discoloration, namely low performance degradation, can thus be produced.

The illuminator according to the present invention uses the fluorescent material comprising the above-mentioned β-Sialon. Since the β-Sialon is thermally and chemically stable, the brightness of the fluorescent material comprising the β-Sialon does not change much when used at high temperatures, and the material has long operating life. The β-Sialon fluorescent material uses blue LED which can emit visible light with wavelengths of 440 to 480 nm, or ultraviolet LED which can emit ultraviolet light with wavelengths of 350 to 410 nm, as its luminescence source. By combining the light from the above-mentioned luminescence source and the β-Sialon fluorescent material, and with red or blue fluorescent materials as required, white light can be produced easily. The illuminator according to the present invention can be used for various applications such a backlight of display device such a liquid crystal display device and general illuminators for indoor and outdoor use.

BRIEF DESCRIPTION OF THE REFERENCE CHARACTERS

Figure 1:
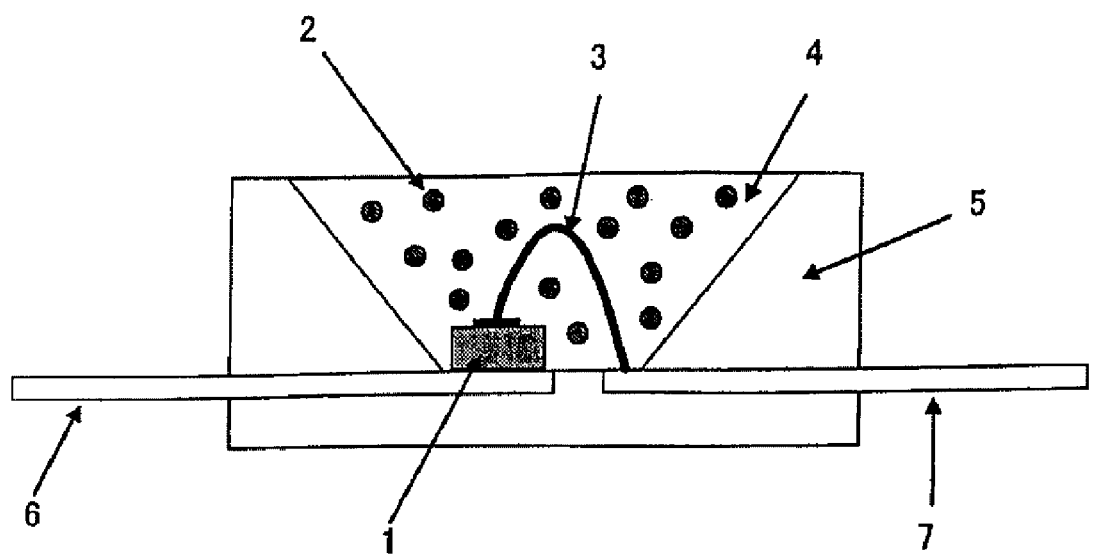
FIG. 1 is a schematic diagram of the illuminator (surface-mount LED) related to the embodiments of the present invention.

1: Blue LED chip
2: Fluorescent material

3: Wire
4: Encapsulation resin
5: Package
6, 7: Conductive terminals

BEST MODES FOR CARRYING OUT THE INVENTION

Hereinafter, an explanation in detail is given of forms of implementation of the present invention The composition of the fluorescent material comprising a β-Sialon of the present invention is expressed by the general formula, $Si_{6-z}Al_zO_zN_{8-z}$. In order to develop and obtain substantial fluorescence property, the Eu content preferably falls within the range from 0.05 to 0.3% by atom.

The particle diameter distribution of the fluorescent material comprising a β-Sialon of the present invention measured by the laser diffraction scattering method is as follows: cumulative 10% diameter ($D_{10}$) on a volumetric basis falls within the 7 μm to 20 μm range, whereas 90% diameter ($D_{90}$) falls within the 50 μm to 90 μm range. By specifying $D_{10}$ and $D_{90}$, β-Sialon fluorescent material powder having specific particle diameter distribution width can be obtained. The present inventors found that by securing specific particle diameter distribution width, degradation of dispersion properties or discoloration of the fluorescent material powder can be prevented in applications for illuminators, even if particle diameter of the fluorescent powder remains large, and thus have achieved the present invention. Specifically, the fluorescence intensity increases if 10% diameter ($D_{10}$) is 7 μm or larger, and favorable dispersion properties can be obtained if it is 20 μm or smaller. The fluorescence intensity increases if 90% diameter ($D_{90}$) is 50 μm or larger, and favorable dispersion properties can be obtained if it is 90 μm or smaller. To obtain the intended effect of the present invention, the 10% diameter ($D_{10}$) preferably falls within the 8 μm to 15 μm range, while the 90% diameter ($D_{90}$) within the 60 μm to 80 μm range.

A process for producing a fluorescent material comprising a β-Sialon of the present invention is produced using raw powder obtained by mixing silicon nitride powder, aluminum nitride powder, aluminum oxide powder, or aluminum-containing compound that produces aluminum oxide as a result of decomposition by heating, and europium oxide powder, or europium-containing compound that produces europium oxide as a result of decomposition by heating, to obtain desired β-Sialon composition. The present invention heats up the raw powder in the nitrogen or nonoxidized atmosphere to obtain a fluorescent material comprising a β-Sialon. Specifically, by maintaining the above-mentioned raw material at the temperature of 1850° C. to 2050° C. for 9 hours or longer, the fluorescent material comprising a β-Sialon having the above-mentioned particle diameter distribution can be obtained. Consequently, the luminescence characteristics of the fluorescent material obtained by the relevant production method does not degrade because of that specific particle diameter distribution.

The aluminum-containing compounds that produce aluminum oxide as a result of decomposition by heating in the present invention include aluminum hydroxide and aluminum nitrate, whereas the europium-containing compounds that produce europium oxide as a result of decomposition by heating include europium hydroxide, europium nitrate, and europium oxalate.

As described above, the specific method for obtaining specific particle diameter distribution width in which the cumulative 10% diameter ($D_{10}$) on a volumetric basis falls within the 7 μm to 20 μm range, and 90% diameter ($D_{90}$) within the 50 μm to 90 μm range, is to maintain the heating/burning temperature at the 1850° C. to 2050° C. range, and perform burning time for 9 hours or longer.

Conventionally, the optimum burning temperature of β-Sialon fluorescent materials has been specified as 1820° C. to 2200° C., and the atmospheric pressure as 0.1 to 100 MPa, but no specific burning time has been specified, with 2 hours and 8 hours only presented as examples (see Patent Reference 8). The present inventors studied the relevant heating conditions experimentally, and found that by maintaining the burning time at 9 hours or longer when specific materials are used, a fluorescent material comprising a β-Sialon having specific particle diameter distribution can be obtained.

Conventionally, the average particle diameter could be maintained relatively large by performing pulverization or classification after heating/burning, even if the burning time is 8 hours or shorter. In the application for illuminators, however, degraded dispersion properties and resulting discoloration have been problems. In the present invention, by maintaining burning time at 9 hours or longer in heating/burning, a fluorescent material comprising a β-Sialon having specific particle diameter distribution can be obtained. There is no upper limit to the burning time. However, even if burning time is made for a very long time, the effect of obtaining specific particle diameter distribution cannot be improved significantly, while economic loss increases. Consequently, the upper limit is preferably set at 48 hours.

The nitrogen or nonoxidizing atmosphere at heating suitable for producing the fluorescent material comprising a β-Sialon of the present invention is 0.3 MPa to 4 MPa.

The process for producing fluorescent material comprising a β-Sialon of the present invention can also be possible by heating raw powder at least twice, and by performing deagglomeration in between multiple heating operations. In this case, the temperature of nitrogen or nonoxidizing atmosphere at heating, pressure, and burning time in heating/burning performed prior to deagglomeration operation are preferably maintained at 1350° C. to 1700° C., 0.1 MPa to 1 MPa, and 1 minute to 12 hours, respectively. After burning, the product cooled down and taken out is deagglomerated. Specific deagglomeration methods include directly sieving the product depending on the degree of coagulation, or sieving can be performed after breaking down the product by human power, pressing it down by human power using a roller or other tools, lightly tapping it using a pestle, or breaking it down by grinding.

In the present invention, heating is repeated in the nitrogen or nonoxidizing atmosphere, following the above-mentioned deagglomeration operations. The preferable heating conditions at this time are the temperature of 1820° C. to 2200° C., atmospheric pressure of 0.1 MPa to 100 MPa, and holding time of one hour or longer, for example.

The present invention uses the above-mentioned mixed powder as a starting material. The use of mixed powder to which a β-Sialon is added by 1.5% to 10% by mass facilitates the adjustment of particle diameter distribution width at the time of heating/burning, and is therefore further desirable. The β-Sialon content was determined to be 1.5% to 20% by mass because the effect of the present invention is obtained stably at 1.5% or higher by mass and the above-mentioned effect can be obtained at 20% or lower.

A container enclosing the starting material for heating must be made of a material that does not alter under heating conditions, or does not react with any of the starting material, product of burning, and atmospheric gases. Such materials include boron nitride (BN), for example. The use of molded boron nitride material having density of 1.75 g/cm$^3$ or higher, preferably pyrolytic boron nitride (P-BN) having density of 2.10 g/cm³ or higher, is further preferable, because adjustment of particle diameter distribution at the time of heating/burning is facilitated. It is further desirable that the bulk of the starting material can be increased by decreasing the bulk density (initial bulk density in JIS R 1628-1997) to 1.0 g/cm³ or lower, when filling the container with the starting material, from the viewpoint of preventing particles from coagulating under heating conditions.

The final particle diameter of the β-Sialon obtained by performing the above-mentioned operations can be adjusted by performing deagglomeration, and classification as required. Specific deagglomeration methods include sieving, breaking down by human power, pressing down by human power using a roller or other tools, lightly tapping using a pestle, breaking down by grinding, using a grinding machine such as millstone, stone mill, ball mill, vibrating mill, or jet mill, or sieving can be performed after the above operations as required.

Specific classification methods include sieving, air classification, elutriation classification, and centrifugal sedimentation classification. Since particle diameter becomes smaller if deagglomeration is made harder, the deagglomeration in the present invention is preferably performed by adopting relatively light methods such as sieving, breaking down by human power, pressing down by human power using a roller or other tools, lightly tapping using a pestle, breaking down by grinding, and the above methods followed by sieving.

The particle diameter distribution of the fluorescent material comprising a β-Sialon of the present invention can be adjusted by performing deagglomeration, and classification as required. The particle diameter distribution of the fluorescent material comprising a β-Sialon of the present invention measured by the laser diffraction scattering method is as follows: cumulative 10% diameter ($D_{10}$) on a volumetric basis falls within the 7 μm to 20 μm range, and 90% diameter ($D_{90}$) within the 50 μm to 90 μm range.

Particle diameter distribution measurement methods other than the laser diffraction scattering method include the photo extinction and centrifugal sedimentation method, X-ray transmission method, light shading method, and electrical sensing zone method. The present invention adopts the laser diffraction scattering method because its reproducibility is good and operation is relatively easy. With this method, however, the particle diameter distribution cannot be measured accurately, if part of particles remains attached to the surface of other particles. To obtain accurate measurement, appropriate dispersant is added to eliminate attachment of particles in a liquid, which is the medium of the particles, thus achieving complete particle dispersion, and furthermore supersonic waves are applied before carrying out measurements.

Identification of the crystal structure of the fluorescent material comprising a β-Sialon can be performed using a powder X-ray diffraction system, etc., whereas the luminescence intensity can be found by measuring the intensity of fluorescent light of specified wavelength at the time of irradiation of excitation light of given wavelength and intensity, using a fluorescent spectrophotometer.

The fluorescent material comprising a β-Sialon is used for illuminators comprising an illumination source and a fluorescent material. Since luminescence properties having a peak in the wavelength range of 500 nm to 550 nm can be obtained by irradiating ultraviolet or visible light containing 350 nm to 550 nm wavelengths as an excitation source, combination with an ultraviolet or blue LED, and with red and/or blue fluorescent material as required, facilitates obtaining white light. In addition, the β-Sialon does not degrade even if exposed to high temperature and is excellent in resistance to heat, which ensures high brightness and long operating life of the illuminators adopting the β-Sialon.

Unlike indicator lamps, a major application of illuminators that emit white light is to illuminate objects, which is why a stable color tone is required to reflect the colors of objects. Consequently, it is required to have stable luminescence intensity for not only the blue LED, which is a luminescence source, but also the β-Sialon, which is a fluorescent material.

The illuminators of the present invention include at least one luminescence source and a fluorescent material comprising a β-Sialon. The illuminators of the present invention include LEDs and fluorescent lamps. LEDs can be manufactured by using the fluorescent material of the present invention by a known method disclosed in the Patent References 9 to 11, for example. In this case, it is desirable to use an ultraviolet LED or blue LED having the wavelength ranging from 350 nm to 500 nm as a luminescence source. It is further desirable to use a blue LED having the wavelength that falls within the 440 nm to 480 nm range. These light-emitting devices include those comprising nitride semiconductors such as GaN and InGaN. By adjusting their compositions, they can be made into a luminescence source having a desired wavelength.

In addition to the method of using the fluorescent material comprising a β-Sialon of the present invention by itself for illuminators, by combining it with other fluorescent materials having different luminescence properties, illuminators capable of providing desired colors can be embodied. If a blue LED is used as an excitation source, in particular, combination of a fluorescent material comprising a β-Sialon of the present invention and another fluorescent material emitting yellow light allows emission of white light of wide color temperature range. These fluorescent materials include an α-Sialon in which Eu is dissolved. Furthermore, by combining with a red fluorescent material such as $CaSiAlN_3$:Eu, color reproducibility and color rendering can be improved, which allows applications for backlights having optimum color reproducibility for display device such as liquid crystal display device and various general illuminators having excellent color rendering for indoor and outdoor use.

EXAMPLE

Description of Example 1

95.5% by mass of the α type silicon nitride powder (made by DENKI KAGAKU KOGYO KABUSHIKI KAISHA, grade NP-600, oxygen content: 1.3% by mass), 3.3% by mass of aluminum nitride powder (made by TOKUYAMA Corp., grade F, oxygen content: 0.9% by mass), 0.4% by mass of aluminum oxide powder (made by TAIMEI CHEMICALS CO., LTD., grade TM-DAR), and 0.8% by mass of europium oxide powder (made by SHIN-ETSU CHEMICAL Co., Ltd., grade RU) were prepared as shown in Table 1 to obtain 1.0 kg in total. Here, Eu content is maintained at 0.09% by atom.

TABLE 1

| | Composition (% by mass) | | | | Eu content (% by atom) | BN container density (g/cm³) | Burning condition | | |
|---|---|---|---|---|---|---|---|---|---|
| | | | | | | | Holding time (hr) | T (° C.) | P (MPa) |
| | Si₃N₄ | AlN | Al₂O₃ | Eu₂O₃ | | | | | |
| Ex. 1 | 95.5 | 3.3 | 0.4 | 0.8 | 0.09 | 1.80 | 12 | 1950 | 0.9 |
| Ex. 2 | 94.2 | 3.5 | 1.0 | 1.3 | 0.14 | 1.80 | 24 | 1900 | 0.9 |
| Ex. 3 | 93.9 | 3.5 | 1.0 | 1.6 | 0.18 | 1.80 | 36 | 1850 | 0.5 |
| Ex. 4 | 93.0 | 4.0 | 2.2 | 0.8 | 0.09 | 1.80 | 10 | 2000 | 2.0 |
| C. Ex. 1 | 95.5 | 3.3 | 0.4 | 0.8 | 0.09 | 1.80 | 8 | 1950 | 0.9 |
| C. Ex. 2 | 93.9 | 3.5 | 1.0 | 1.6 | 0.18 | 1.80 | 8 | 1850 | 0.5 |
| Ex. 11 | 95.5 | 3.3 | 0.4 | 0.8 | 0.09 | (Pyrolitic BN container) | 12 | 1950 | 0.9 |
| C. Ex. 4 | 95.5 | 3.3 | 0.4 | 0.8 | 0.09 | 1.60 | 12 | 1950 | 0.9 |

The prepared powder was blended in dry state using a rocking mixer (made by AICHI ELECTRIC CO., LTD., RM-10) for 60 minutes, and then sieved with a 150 μm stainless sieve to obtain raw powder for synthesizing the β-Sialon. The raw powder was enclosed into a 100 milliliter graduated cylinder, and the bulk density of the powder was calculated, by dividing its mass by bulk volume, to be 0.4 g/cm³.

The raw powder was measured by 580 g in a lidded cylindrical container made of boron nitride (made by DENKI KAGAKU KOGYO KABUSHIKI KAISHA, grade N-1, density: 1.80 g/cm³) having inner diameter of 14.8 cm and height of 13.8 cm, which was then heated by an electric furnace having carbon heaters in the 0.9 MPa pressurized nitrogen atmosphere at 1950° C. for 12 hours. The obtained product was a loosely coagulated mass, which was broken into flakes easily with human fingers wearing clean rubber gloves. After undergoing the light crushing, the product was sifted through a mesh of 45 μm sieve. 550 g of synthesized powder was obtained through these operations. The obtained powder was then subjected to X-ray powder diffraction measurement with an X-ray diffraction instrument (made by MAC SCIENCE, MXP3), and the synthesized powder was found to be a single-phase β-Sialon. As a result of performing particle diameter distribution measurement using a particle distribution measuring instrument made by Coulter (model LS-230), cumulative 10% diameter ($D_{10}$) on a volumetric basis was found to be 8.5 μm, and 90% diameter ($D_{90}$) was 63.2 μm. The specimens for measuring particle diameter were prepared under the silicon nitride measurement conditions listed in Table 1 with interpretations of JIS R 1629-1997, in principle.

Fluorescence spectrum at blue light excitation (wavelength: 455 nm) was measured using a fluorescent spectrophotometer made by HITACHI HIGH-TECHNOLOGIES Co. to find the peak intensity (luminescence intensity) and peak wavelength of the spectrum. Since the peak intensity varies depending on measuring instruments used or measurement conditions, relative comparison was performed between the results of Examples and Comparative Examples measured under the identical conditions. The results of the comparison are listed in Table 2.

As shown in Table 2, the peak intensity of the fluorescent spectrum at 455 nm excitation of the β-Sialon fluorescent material in example 1 was 665 (arbitrary scale), and its peak wavelength was 541 nm.

TABLE 2

| | Result of X-ray powder diffraction measurement | $D_{10}$ (μm) | $D_{90}$ (μm) | Fluorescent spectrum (455 nm excitation) | |
|---|---|---|---|---|---|
| | | | | Peak intensity (arbitrary scale) | Peak wavelength (nm) |
| Ex. 1 | β-Sialon | 8.5 | 63.2 | 665 | 541 |
| Ex. 2 | β-Sialon | 10.9 | 77.9 | 643 | 538 |
| Ex. 3 | β-Sialon | 12.6 | 78.4 | 692 | 536 |
| Ex. 4 | β-Sialon | 7.5 | 56.9 | 686 | 540 |
| C. Ex. 1 | β-Sialon | 6.8 | 44.4 | 496 | 540 |
| C. Ex. 2 | β-Sialon | 6.4 | 41.5 | 481 | 533 |
| Ex. 5 | β-Sialon | 9.2 | 71.2 | 720 | 540 |
| Ex. 6 | β-Sialon | 12.7 | 77.9 | 706 | 539 |
| Ex. 7 | β-Sialon | 19.1 | 87.0 | 735 | 535 |
| Ex. 8 | β-Sialon | 8.1 | 62.1 | 686 | 541 |
| C. Ex. 3 | β-Sialon | 6.8 | 47.0 | 536 | 540 |
| Ex. 9 | β-Sialon | 10.8 | 73.3 | 716 | 541 |
| Ex. 10 | β-Sialon | 12.9 | 80.2 | 745 | 540 |
| Ex. 11 | β-Sialon | 10.1 | 68.1 | 725 | 541 |
| C. Ex. 4 | β-Sialon | 6.7 | 44.6 | 469 | 540 |

Description of Examples 2 to 4, and Comparative Examples 1 and 2

Examples 2 to 4 used the same raw powder as that used in Example 1, and the synthesized powder was obtained in the same manner as Example 1 except for the composition and burning conditions changed as shown in Table 1.

As shown in Table 1, the raw powder used in Example 2 was prepared by mixing 94.2% by mass of α type silicon nitride powder, 3.5% by mass of aluminum nitride powder, 1.0% by mass of aluminum oxide powder and 1.3% by mass of europium oxide powder to obtain 1.0 kg of raw powder. The Eu content in this case was 0.14% by atom, and heating was performed at 900° C. for 24 hours in the 0.9 MPa pressurized nitrogen atmosphere.

The raw powder used in Example 3 was prepared by mixing 93.9% by mass of α type silicon nitride powder, 3.5% by mass of aluminum nitride powder, 1.0% by mass of aluminum oxide powder and 1.6% by mass of europium oxide powder to obtain 1.0 kg of raw powder. The Eu content in this case was 0.18% by atom, and heating was performed at 1850° C. for 36 hours in the 0.5 MPa pressurized nitrogen atmosphere.

The raw powder used in Example 4 was prepared by mixing 93.0% by mass of α type silicon nitride powder, 4.0% by mass of aluminum nitride powder, 2.2% by mass of aluminum oxide powder and 0.8% by mass of europium oxide powder to obtain 1.0 kg of raw powder. The Eu content in this case was 0.09% by atom, and heating was performed at 2000° C. for 10 hours in the 2.0 MPa pressurized nitrogen atmosphere.

The raw powder used in Comparative Example 1 was prepared by mixing 95.5% by mass of α type silicon nitride powder, 3.3% by mass of aluminum nitride powder, 0.4% by mass of aluminum oxide powder and 0.8% by mass of europium oxide powder to obtain 1.0 kg of raw powder. The Eu content in this case was 0.09% by atom, and heating was performed at 1950° C. for 8 hours in the 0.9 MPa pressurized nitrogen atmosphere.

The raw powder used in Comparative Example 2 was prepared by mixing 93.9% by mass of α type silicon nitride powder, 3.5% by mass of aluminum nitride powder, 1.0% by mass of aluminum oxide powder and 1.6% by mass of europium oxide powder to obtain 1.0 kg of raw powder. The Eu content in this case was 0.18% by atom, and heating was performed at 1850° C. for 8 hours in the 0.5 MPa pressurized nitrogen atmosphere.

The raw powder was then subjected to X-ray powder diffraction, particle diameter distribution, and fluorescence intensity measurements in the same manner as Example 1. The results are listed in Table 2.

As shown in Table 2, the synthesized powder obtained in Examples 2 to 4 and Comparative Examples 1 and 2 was a single-phase of β-Sialon. $D_{10}$ obtained in particle diameter distribution measurement of the β-Sialon in Example 2 was 10.9 μm, whereas $D_{90}$ was 77.9 μm. The peak intensity of the fluorescent spectrum at 455 nm excitation of the β-Sialon in Example 2 was found to be 643, and its peak wavelength was 538 nm.

$D_{10}$ obtained in particle diameter distribution measurement of the β-Sialon in Example 3 was 12.6 μm, whereas $D_{90}$ was 78.4 μm. The peak intensity of the fluorescent spectrum at 455 nm excitation of the β-Sialon obtained in Example 3 was 692, and its peak wavelength was 536 nm.

$D_{10}$ obtained by particle diameter distribution measurement of the β-Sialon in Example 4 was 7.5 μm, whereas $D_{90}$ was 56.9 μm. The peak intensity of the fluorescent spectrum at 455 nm excitation of this β-Sialon was 686, and its peak wavelength was 540 nm.

$D_{10}$ obtained by particle diameter distribution measurement of the β-Sialon in Comparative Example 1 was 6.8 μm, whereas $D_{90}$ was 44.4 μm. The peak intensity of the fluorescent spectrum at 455 nm excitation of the β-Sialon in Comparative Example 1 was 496, and its peak wavelength was 540 nm.

$D_{10}$ obtained by particle diameter distribution measurement of the β-Sialon in Comparative Example 2 was 6.4 μm, whereas $D_{90}$ was 41.5 μm. The peak intensity of the fluorescent spectrum at 455 nm excitation of the β-Sialon in Comparative Example 2 was 481, and its peak wavelength was 533 nm.

Description of Example 5

In Example 5, 560 g of the same raw powder as the one used in Example 1 was enclosed in a lidded cylindrical container made of boron nitride (made by DENKI KAGAKU KOGYO KABUSHIKI KAISHA, grade N-1, density: 1.78 g/cm$^3$) having inner diameter of 14.8 cm and height of 13.8 cm, which was then subjected to heat treatment by an electric furnace having carbon heaters in the pressurized nitrogen atmosphere of 0.9 MPa at 1500° C. for one hour. After cooling, the burned product taken out of the container was sifted with an mesh of 833 μm (20 mesh) nylon sieve, the sieved product was enclosed back into the container and then subjected to heat treatment in a pressurized nitrogen atmosphere of 0.9 MPa at 1950° C. for 8 hours. The obtained product was a loosely coagulated mass, which was broken into flakes easily with human fingers wearing clean rubber gloves. After undergoing the light crushing, the product was sifted through a 45 μm sieve. 450 g of synthesized powder was obtained through these operations. The obtained powder was then subjected to X-ray powder diffraction measurement, and the synthesized powder was found to be a single-phase β-Sialon. As a result of performing particle diameter distribution measurement by the laser diffraction scattering method, cumulative 10% diameter ($D_{10}$) on a volumetric basis was found to be 9.2 μm, and $D_{90}$ was 71.2 μm.

Furthermore, fluorescent spectrum was measured to determine the peak intensity (luminescence intensity) and peak wavelength of the spectrum. Table 2 shows the results obtained. The peak intensity of the fluorescent spectrum at 455 nm excitation of the β-Sialon fluorescent material obtained in Example 5 was 720, and its wavelength was 540 nm.

Description of Examples 6 to 8 and Comparative Example 3

Burning was performed twice as in the same manner as Example 5, except that the composition and burning conditions of the raw powder in Examples 6 to 8 and Comparative Example 3 were changed as shown in Table 3.

As shown in Table 3, the raw powder used in Example 6 was prepared by mixing 94.2% by mass of α type silicon nitride powder, 3.5% by mass of aluminum nitride powder, 1.0% by mass of aluminum oxide powder and 1.3% by mass of europium oxide powder to obtain 1.0 kg of raw powder. The Eu content in this case was 0.14% by atom. As for the baking conditions, the first heating was performed at 1600° C. for 2 hours in the 0.8 MPa pressurized nitrogen atmosphere, and the second heating was performed at 1900° C. for 24 hours in the 0.9 MPa pressurized nitrogen atmosphere.

TABLE 3

| | Composition (% by mass) | | | | Eu content (% by atom) | BN container density (g/cm$^3$) | Condition of 1st heating | | | Condition of 2nd heating | | |
|---|---|---|---|---|---|---|---|---|---|---|---|---|
| | Si$_3$N$_4$ | AlN | Al$_2$O$_3$ | Eu$_2$O$_3$ | | | Holding time (hr) | Te (° C.) | P (MPa) | Holding time (hr) | T (° C.) | P (MPa) |
| Ex. 5 | 95.5 | 3.3 | 0.4 | 0.8 | 0.09 | 1.78 | 1 | 1500 | 0.9 | 12 | 1950 | 0.9 |
| Ex. 6 | 94.2 | 3.5 | 1.0 | 1.3 | 0.14 | 1.78 | 2 | 1600 | 0.8 | 24 | 1900 | 0.9 |
| Ex. 7 | 93.9 | 3.5 | 1.0 | 1.6 | 0.18 | 1.78 | 4 | 1400 | 0.5 | 36 | 1850 | 0.5 |
| Ex. 8 | 93.0 | 4.0 | 2.2 | 0.8 | 0.09 | 1.78 | 1 | 1600 | 1.5 | 10 | 2000 | 2.0 |
| C. Ex. 3 | 95.5 | 3.3 | 0.4 | 0.8 | 0.09 | 1.78 | 1 | 1800 | 0.9 | 12 | 1950 | 0.9 |

The raw powder used in Example 7 was prepared by mixing 93.9% by mass of α type silicon nitride powder, 3.5% by mass of aluminum nitride powder, 1.0% by mass of aluminum oxide powder and 1.6% by mass of europium oxide powder to obtain 1.0 kg of raw powder. The Eu content in this case was 0.18% by atom. As for the baking conditions, the first heating was performed at 1400° C. for 4 hours in the 0.5 MPa pressurized nitrogen atmosphere, and the second heating was performed at 1850° C. for 36 hours in the 0.5 MPa pressurized nitrogen atmosphere.

The raw powder used in Example 8 was prepared by mixing 93.0% by mass of α type silicon nitride powder, 4.0% by mass of aluminum nitride powder, 2.2% by mass of aluminum oxide powder and 0.8% by mass of europium oxide powder to obtain 1.0 kg of raw powder. The Eu content in this case was 0.09% by atom. As for the baking conditions, the first heating was performed at 1600° C. for 1 hour in the 1.5 MPa pressurized nitrogen atmosphere, and the second heating was performed at 2000° C. for 10 hours in the 2.0 MPa pressurized nitrogen atmosphere.

The raw powder used in Comparative Example 3 was prepared by mixing 95.5% by mass of α type silicon nitride powder, 3.3% by mass of aluminum nitride powder, 0.4% by mass of aluminum oxide powder and 0.8% by mass of europium oxide powder to obtain 1.0 kg of raw powder. The Eu content in this case was 0.09% by atom. As for the baking conditions, the first heating was performed at 1800° C. for 1 hour in the 0.9 MPa pressurized nitrogen atmosphere, and the second heating was performed at 1950° C. for 12 hours in the 0.9 MPa pressurized nitrogen atmosphere.

The raw powder was then subjected to X-ray powder diffraction, particle diameter distribution, and fluorescence intensity measurements in the same manner as Example 5. The results are listed in Table 2.

As shown in Table 2, the synthesized powder obtained in Examples 6 to 8 and Comparative Examples 3 was a single-phase β-Sialon. $D_{10}$ obtained by particle diameter distribution measurement of the β-Sialon in Example 6 was 12.7 μm, whereas $D_{90}$ was 77.9 μm. The peak intensity of the fluorescent spectrum at 455 nm excitation of the β-Sialon obtained in Example 6 was 706, and its peak wavelength was 539 nm.

$D_{10}$ obtained by particle diameter distribution measurement of the β-Sialon in Example 7 was 19.1 μm, whereas $D_{90}$ was 87.0 μm. The peak intensity of the fluorescent spectrum at 455 nm excitation of the β-Sialon was 735, and its peak wavelength was 535 nm.

$D_{10}$ obtained by particle diameter distribution measurement of the β-Sialon in Example 8 was 8.1 μm, whereas $D_{90}$ was 62.1 μm. The peak intensity of the fluorescent spectrum at 455 nm excitation of the β-Sialon was 686, and its peak wavelength was 541 nm.

$D_{10}$ obtained by particle diameter distribution measurement of the β-Sialon in Comparative Example 3 was 6.8 μm, whereas $D_{90}$ was 47.0 μm. The peak intensity of the fluorescent spectrum at 455 nm excitation of the β-Sialon was 536, and its peak wavelength was 540 nm.

Description of Example 9

In Example 9, synthesized powder was obtained in the same manner as Example 1 except that β-Sialon powder was added by 3% by mass. The raw powder thus obtained was subjected to X-ray powder diffraction, particle diameter distribution, and fluorescence intensity measurements as in Example 1, and the results are listed in Table 2. The table indicates that the synthesized powder obtained in Example 9 was a single-phase β-Sialon. $D_{10}$ obtained by particle diameter distribution measurement of the β-Sialon in Example 9 was 10.8 μm, whereas $D_{90}$ was 73.3 μm. The peak intensity of the fluorescent spectrum at 455 nm excitation of the β-Sialon obtained in Example 9 was 716, and its peak wavelength was 541 nm.

Description of Example 10

In Example 10, synthesized powder was obtained in the same manner as Example 5 except that β-Sialon powder was added by 10% by mass. The raw powder thus obtained was subjected to X-ray powder diffraction, particle diameter distribution, and fluorescence intensity measurements as in Example 5, and the results are listed in Table 2. The table indicates that the synthesized powder obtained in Example 10 was a single-phase β-Sialon. $D_{10}$ obtained by particle diameter distribution measurement of the β-Sialon in Example 10 was 12.9 μm, whereas $D_{90}$ was 80.2 μm. The peak intensity of the fluorescent spectrum at 455 nm excitation of the β-Sialon obtained in Example 10 was 745, and its peak wavelength was 540 nm.

Description of Example 11

The synthesized powder used in Example 11 was obtained in the same manner as Example 1, as shown in Table 1, except that a cylindrical pyrolytic boron nitride container (made by SHIN-ETSU CHEMICAL Co., Ltd., density: 2.10 g/cm$^3$) was used. The raw powder thus obtained was subjected to X-ray powder diffraction, particle diameter distribution, and fluorescence intensity measurements as in Example 1, and the results are listed in Table 2. The table indicates that the synthesized powder obtained in Example 11 was a single-phase β-Sialon. $D_{10}$ obtained by particle diameter distribution measurement of the β-Sialon in Example 11 was 10.1 μm, whereas $D_{90}$ was 68.1 μm. The peak intensity of the fluorescent spectrum at 455 nm excitation of the β-Sialon obtained in Example 11 was 725, and its peak wavelength was 541 nm.

Description of Comparative Example 4

The synthesized powder used in Comparative Example 4 was obtained in the same manner as Example 1, as shown in Table 1, except that a cylindrical boron nitride container (made by DENKI KAGAKU KOGYO KABUSHIKI KAISHA, grade NB-1000) having a density of 1.60 g/cm$^3$ was used. The raw powder thus obtained was subjected to X-ray powder diffraction, particle diameter distribution, and fluorescence intensity measurements as in Example 1, and the results are listed in Table 2. The table indicates that the synthesized powder obtained in Comparative Example 4 was a single-phase β-Sialon. $D_{10}$ obtained by particle diameter distribution measurement of the β-Sialon in Comparative Example 4 was 6.7 μm, whereas $D_{90}$ was 44.6 μm. The peak intensity of the fluorescent spectrum at 455 nm excitation of the β-Sialon obtained in Comparative Example 4 was 469, and its peak wavelength was 540 nm.

Description of Examples 12 to 22 and Comparative Examples 5 to 8

The β-Sialon fluorescent material of 10 g obtained in Examples 1 to 11 and Comparative Examples 1 to 4 was added to 100 g water along with epoxy silane coupling agent (made by SHIN-ETSU SILICONE Co., Ltd., KBE402), and left overnight while being mixed. Then, an appropriate amount of the above Sialon fluorescent material treated with filtered and dried silane coupling agent was mixed in 10 g of epoxy resin (made by SANYU REC CO., LTD., NLD-SL-2 101), the mixture was potted on a chip of blue LED having luminescence wavelength of 460 mm, subjected to vacuum degassing, and the resin was heated for hardening at approximately 110° C., to prepare surface-mount LEDs used for Examples 12 to 22 and Comparative Examples 5 to 8. Electric current of 10 mA was flown to the LEDs, and the luminescence spectrum of the generated light was measured to determine the efficiency of the lamp. Table 4 shows the obtained results.

TABLE 4

|  | Lamp efficiency (Lm/W) |
|---|---|
| Ex. 12 | 42.1 |
| Ex. 13 | 40.6 |
| Ex. 14 | 46.2 |
| Ex. 15 | 44.4 |
| Ex. 16 | 50.3 |
| Ex. 17 | 49.1 |
| Ex. 18 | 52.4 |
| Ex. 19 | 44.8 |
| Ex. 20 | 50.8 |
| Ex. 21 | 54.6 |
| Ex. 22 | 51.3 |
| Com. Ex. 5 | 32.3 |
| Com. Ex. 6 | 30.8 |
| Com. Ex. 7 | 34.2 |
| Com. Ex. 8 | 28.9 |

FIG. 1 shows the structure of the above-mentioned surface-mounted type LED (white LED). Specifically, a blue LED chip 1 connected to a conductive terminal 6 was installed at the bottom of a package 5, the blue LED chip 1 was connected to another conductive terminal 7 with a wire 3, and then the Sialon fluorescent material 2 and encapsulation resin (epoxy resin) 4 were heated for hardening to constitute the LED. Electric current of 10 mA was flown to the LED, and the luminescence spectrum of the generated light was measured.

As shown in Table 4, the lamp efficiency (Lm/W) of the LED in Examples 12, 13, and 14 was 42.1, 40.6, and 46.2, respectively. The lamp efficiency (Lm/W) of the LED in Examples 15, 16, and 17 was 44.4, 50.3, and 49.1, respectively. The lamp efficiency (Lm/W) of Examples 18, 19, and 20 was 52.4, 44.8, and 50.8, respectively. The lamp efficiency (Lm/W) of the LED in Examples 21 and 22 was 54.6 and 51.3, respectively.

Meanwhile, the lamp efficiency (Lm/W) of the LED in Comparative Examples 5, 6, 7, and 8 was 32.3, 30.8, 34.2, and 28.9 respectively.

INDUSTRIAL APPLICABILITY

The β-Sialon fluorescent material of the present invention, which exhibits luminescence property having its peak in the 500 to 550 nm range excited by 350 to 500 nm excitation light owing to its specific crystallographic structure and particle diameter distribution, is ideal for an illuminator using ultraviolet or blue light as a luminescence source. The fluorescent material is particularly suitable for white LEDs having ultraviolet or blue LED as its luminescence source, and thus industrially very useful.

The process for producing of the Sialon fluorescent material of the present invention provides fluorescent material powder comprising a β-Sialon having high fluorescent intensity easily and at low cost, and is therefore industrially extremely useful.

Because of stable color tone, high resistance to heat, and the use of fluorescent material powder comprising a β-Sialon having minimum luminescence property change by temperature, the illuminator of the present invention can produce proper colors of objects while maintaining high brightness over a long period of time, and is therefore industrially very useful.

What is claimed is:

1. A fluorescent material characterized in that:
the fluorescent material comprising:
a β-Sialon expressed by the general formula $Si_{6-z}Al_zO_z N_{8-z}$, where $0 \leq z \leq 4.2$, as a host material;
and Eu dissolved in solid solution as a luminescence center,
wherein said fluorescent material is a powder which, when measured by the laser diffraction scattering method, gives particle diameter distribution in which cumulative 10% diameter ($D_{10}$) falls within the 7 μm to 20 μm range and 90% diameter ($D_{90}$) within the 50 μm to 90 μm range.

2. A process for producing a fluorescent material comprising:
a μ-Sialon expressed by the general formula $Si_{6-z}Al_zO_z N_{8-z}$, where $0 \leq z \leq 4.2$, as a host material; and
Eu dissolved in solid solution as a luminescence center,
wherein said fluorescent material is a powder which, when measured by the laser diffraction scattering method, gives particle diameter distribution in which cumulative 10% diameter ($D_{10}$) falls within the 7 μm to 20 μm range and 90% diameter ($D_{90}$) within the 50 μm to 90 μm rang, characterized in that:
the process including:
a process in which starting materials comprising (i) silicon nitride powder, (ii) at least one of aluminum nitride powder, aluminum oxide powder, and an aluminum-containing compound that produces aluminum oxide as a result of decomposition by heating, and (iii) europium oxide powder or europium-containing compound that produces europium oxide as a result of decomposition by heating are mixed to obtain raw powder; and
a process in which the obtained raw powder is heated in a nitrogen or nonoxidizing atmosphere to obtain β-Sialon fluorescent powder,
wherein said heating is performed at a temperature range from 1850 to 2050° C. for 9 hours or longer.

3. A process for producing a fluorescent material comprising:
a β-Sialon expressed by the general formula $Si_{6-z}Al_zO_z N_{8-z}$, where $0 \leq z \leq 4.2$, as a host material; and
Eu dissolved in solid solution as a luminescence center,
wherein said fluorescent material which, when measured by the laser diffraction scattering method, gives particle diameter distribution in which cumulative 10% diameter ($D_{10}$) falls within the 7 μm to 20 μm range and 90% diameter ($D_{90}$) within the 50 μm to 90 μm rang, characterized in that:
the process including:
a process in which starting materials comprising (i) silicon nitride powder, (ii) at least one of aluminum nitride powder, aluminum oxide powder, and an aluminum-containing compound that produces aluminum oxide as a result of decomposition by heating, and (iii) europium oxide powder or europium-containing compound that produces europium oxide as a result of decomposition by heating are mixed to obtain raw powder; and a process in which the obtained raw powder is heated in a nitrogen or nonoxidizing atmosphere to obtain β-Sialon fluorescent powder, wherein said heating is performed at least twice through a first heating and a second heating, and deagglomeration is performed between said multiple heating operations, the first heating being performed at a temperature of 1350° C. to 1700° C. under a pressure of 0.1 MPa to 1 MPa for a duration of 1 minute to 12 hours, and the second heating being performed at a temperature of 1820° C. to 2200° C. under a pressure of 0.1 MPa to 100 MPa for a duration of one hour or longer.

4. The process for producing a fluorescent material as set forth in claim 2 or 3 characterized in that said starting material contains a β-Sialon by 1.5% to 20% by mass.

5. The process for producing a fluorescent material as set forth in any one of claims 2 to 3 characterized in that said starting material is enclosed in a boron nitride container having density of 1.75 g/cm$^3$ or higher for heating.

6. An illuminator characterized in that:
the illuminator including:
a fluorescent material; and
a luminescence source,
said fluorescent material comprising:
a β-Sialon expressed by the general formula $Si_{6-z}Al_zO_zN_{8-z}$, where $0 \leq z \leq 4.2$, as a host material; and
Eu dissolved in solid solution as a luminescence center,
wherein said fluorescent material is a powder which, when measured by the laser diffraction scattering method, gives particle diameter distribution in which cumulative 10% diameter ($D_{10}$) falls within the 7 μm to 20 μm range and 90% diameter ($D_{90}$) within the 50 μm to 90 μm range.

7. The illuminator as set forth in claim 6 characterized in that said luminescence source emits ultraviolet or visible light.

* * * * *